United States Patent [19]

Kemkers

[11] 4,415,083
[45] Nov. 15, 1983

[54] PACKING FOR A STACK OF ELECTRICAL AND/OR ELECTRONIC PARTS

[75] Inventor: Pieter Kemkers, Eindhoven, Netherlands

[73] Assignee: U.S. Philips Corporation, New York, N.Y.

[21] Appl. No.: 308,965

[22] Filed: Oct. 6, 1981

[30] Foreign Application Priority Data

Nov. 4, 1980 [NL] Netherlands ........................ 8006017

[51] Int. Cl.³ ..................... B65D 59/00; B65D 85/00; B65D 81/00
[52] U.S. Cl. .................................. 206/334; 206/445; 206/499; 206/526
[58] Field of Search ............... 206/445, 334, 328, 817, 206/527, 499, 526

[56] References Cited

U.S. PATENT DOCUMENTS 3,032,179  5/1962  Menolasino ........................ 206/445
4,353,481  10/1982  Tando ................................. 206/328

FOREIGN PATENT DOCUMENTS 2053855  7/1980  United Kingdom ............... 206/499

Primary Examiner—William T. Dixson, Jr.
Attorney, Agent, or Firm—Rolf E. Schneider

[57] ABSTRACT

A package containing a stack of rectangular, plate-shaped parts such as electronic components to be subsequently utilized comprises an elongate tube having a rectangular internal cross section corresponding to that of the parts. A stop member abuts against each end of the stack adjacent the corresponding extremity of the tube. At least one stop member is frictionally slidable in the tube with a clamp fit and has a portion projecting beyond the corresponding extremity of the tube. The arrangement of the two stop members with respect to the stack and the tube is such that, regardless of which extremity of the tube happens to come into contact with an object during transport of the tube, the position of the stack within the tube remains substantially unchanged. The projecting portion of the frictionally slidable stop member enables such stop member to be removed from the tube when it is desired to utilize the stacked parts.

4 Claims, 6 Drawing Figures

PACKING FOR A STACK OF ELECTRICAL AND/OR ELECTRONIC PARTS

This invention relates to a packing for a stack of rectangular electrical plate-shaped and/or electronic parts, comprising an elongate tube whose inner cross-section has a rectangular shape which corresponds to the cross-section of the relevant parts, the stack of parts being bounded by a stop member at both ends, at least one of said stop members being frictionally slidable within the tube.

Packings for parts of the described kind are known per se. A large number of electrical and/or electronic parts having very small dimensions are stacked in such packings. These packings, also referred to as cartridges, can be placed directly in machines which position the parts on printed circuit boards. The parts must occupy the correct position within the packing, which means that the position of the packed parts may not change during transport to the processing machine. It is a drawback of the known packings that dropping or shaking can readily cause a free space within the stack of packed parts. Due to this free space, the parts are likely to occupy undesirable positions within the packings, or the sliding of the stack of parts in the tube is obstructed, or the parts are incorrectly positioned on the printed circuit board.

It is an object of the invention to provide a packing of the present described kind in which the risk of changing the position of the components or parts in the packing during transport is substantially precluded.

In order to realize this object, the package or packing in accordance with the invention is characterized in that a portion of the relevant slidable stop member projects beyond the corresponding extremity of the tube.

In accordance with the invention, the end of the stack of parts which is remote from the slidable stop member may abut or bear against a stop member which is rigidly connected to the tube.

In accordance with the invention it is alternatively possible to bound the stack of parts at both ends by means of a frictionally slidable stop member, each of said stop members projecting beyond the relevant extremity of the tube.

The frictionally slidable stop members can be constructed in many different ways. A condition to be satisfied by all constructions is that there should be adequate friction with respect to the inner wall of the tube and that the stop member should project from the tube.

A preferred embodiment of such a stop member is shaped as a rod of an elastic material, for example, a synthetic material, which has a cross-section such that the rod is slidable in the tube with a clamp fit. For adaptation of the friction of the rod, grooves may be provided on its exterior. The advantage of the projecting stop members consists in that correct postioning of the parts is maintained when the packing collides with an object.

The invention will now be described in detail with reference to the accompanying drawings, in which.

Figures 1, 2, 3:
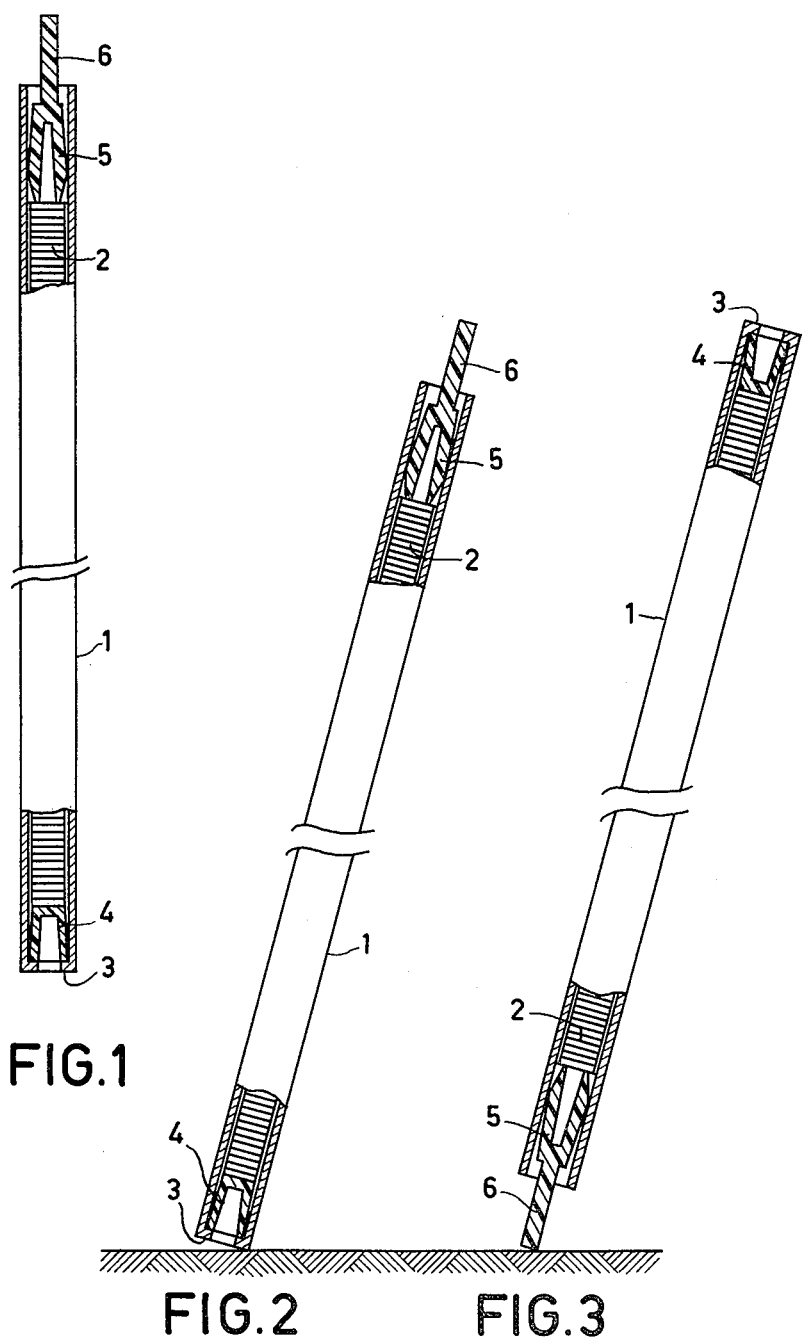
FIG. 1 shows a packing with a stack of parts.
FIGS. 2 and 3 show the packing of FIG. 1 in two situations likely to occur during transport.

Reference numeral 1 in FIG. 1 denotes an elongate tube. The tube 1 has a rectangular internal cross-section. The tube 1 may be made of any suitable material, notably a synthetic material. The tube 1 accommodates a stack of electrical parts 2. These parts, for example, resistors or capacitors, have a prismatic shape with dimensions on the order of a few millimeters. The stack 2 is bounded on one end by a stop member 3 which is rigidly connected to one extremity of the tube 1, a filling member 4 being present between the stop member 3 and the stack 2. The stack is bounded on the other end by a stop member 5 which is clamped in the tube 1 and which is frictionally slidable therein. The stop member 5 is provided with a portion 6 which projects from the other extremity of the tube 1.

The electrical parts can be positioned directly from the packing onto a printed circuit board by means of a suitable processing machine. For trouble-free operation it is necessary that the parts maintain their position within the stack during transport.

FIGS. 2 and 3 illustrate two situations where the stacking of the parts is not disturbed by shocks.

In FIG. 2, the packing hits the floor by way of its end which comprises the rigid stop member 3. As a result of its inertia, the stack 2 will tend to travel further with respect to the tube 1, but this is prevented by the stop member 3.

In FIG. 3, the packing hits the floor by way of its extremity having the slidable stop member 5. The projecting portion 6 of the stop member 5 hits the floor first. The stack 2 as well as the tube 1 will then tend to travel further, but this motion is prevented by the stop member 5 on the one hand and the stop member 3 on the other hand.

Thus, in both cases the stack will be maintained without the spaces between the parts being increased.

Figure 4:
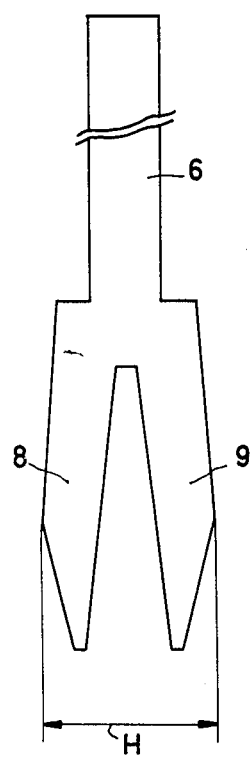
FIGS. 4 and 5 show an embodiment of a stop member in two mutually perpendicular views.
Figure 5:
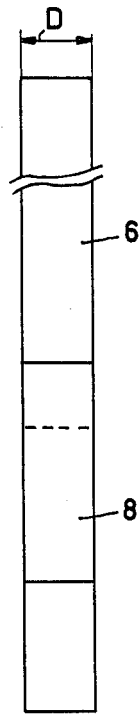

The slidable stop member 5 may be shaped, for example, as shown in FIGS. 4 and 5. Therein, the stop member comprises two legs 8 and 9 having a transverse dimension D which corresponds approximately to the width of the tube 1. The legs 8 and 9 are slightly resilient with respect to each other, on the one hand because of their shape and on the other hand because the entire stop member is made of a synthetic material. In the no-load condition, the dimension H is slightly larger than the dimension of the tube in this direction. Thus, after introduction of the stop member into the tube, it is positioned therein with a clamp fit. The portion 6 of the stop member then projects from the corresponding extremity of the tube.

A simple alternative embodiment of the stop member 5 consists of a round rod of a synthetic material which has a diameter which is slightly larger than the smaller tube dimension. This very simple embodiment is denoted by reference numerals 10, 11 and 12, 13 in FIG. 6.

Figure 6:
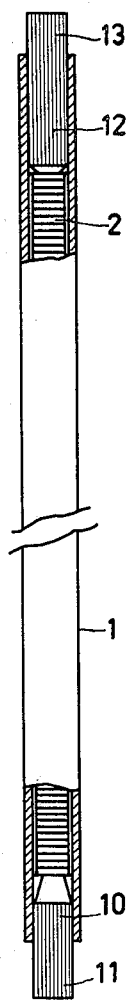
FIG. 6 shows a packing with two slidable stop members.

FIG. 6 shows an embodiment wherein the fixed stop member 3 is replaced by a slidable stop member 10, a portion 11 of which projects from the tube 1. The outer circumferential surface of the two rods 10 and 12 of this embodiment is provided with grooves. It is alternatively possible to use rods having a smooth exterior surface.

It is an additional advantage of the projecting portion of the slidable stop member that the slidable stop member can thus be very simply and also mechanically removed in the processing machine.

The projecting length of the slidable stop member may be made exactly the same for each packing, so that the further processing is facilitated.

As a result of these two factors, the packing may remain closed until the very instant at which the processing commences.

What is claimed is:

1. A package containing a stack of rectangular, plate-shaped parts such as electronic components to be subsequently utilized, which comprises an elongate tube having a rectangular internal cross section corresponding to that of said parts; a first stop member abutting against one end of said stack adjacent one extremity of the tube; and a second stop member abutting against the other end of said stack adjacent the other extremity of the tube, said second stop member having frictionally slidable in said tube with a clamp fit, said second stop member having a portion projecting beyond the other extremity of the tube; the arrangement of the two stop members with respect to the stack and the tube being such that, regardless of which extremity of the tube happens to come into contact with an object during transport of the tube, the position of the stack within the tube remains substantially unchanged; the projecting portion of the second stop member enabling said second stop member to be removed from the tube when it is desired to utilize the stacked parts.

2. A package according to claim 1, in which the first stop member is rigidly connected to the tube.

3. A package according to claim 1, in which the first stop member is also frictionally slidable in said tube with a clamp fit and has a portion projecting beyond the one extremity of the tube.

4. A package according to claim 3, in which each frictionally slidable stop member comprises a round rod formed of an elastic material and having a diameter slightly larger than the smaller dimension of the tube.

* * * * *